US009825170B2

(12) United States Patent
Hirler et al.

(10) Patent No.: US 9,825,170 B2
(45) Date of Patent: Nov. 21, 2017

(54) SEMICONDUCTOR DEVICE COMPRISING A TRANSISTOR ARRAY AND A TERMINATION REGION AND METHOD OF MANUFACTURING SUCH A SEMICONDUCTOR DEVICE

(71) Applicants: Franz Hirler, Isen (DE); Andreas Meiser, Sauerlach (DE); Till Schloesser, Munich (DE)

(72) Inventors: Franz Hirler, Isen (DE); Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/040,624

(22) Filed: Feb. 10, 2016

(65) Prior Publication Data

US 2016/0240661 A1   Aug. 18, 2016

(30) Foreign Application Priority Data

Feb. 13, 2015   (DE) ......................... 10 2015 102 115

(51) Int. Cl.
*H01L 21/00* (2006.01)
*H01L 29/78* (2006.01)
(Continued)

(52) U.S. Cl.
CPC ........ *H01L 29/7823* (2013.01); *H01L 21/765* (2013.01); *H01L 21/823437* (2013.01);
(Continued)

(58) Field of Classification Search
CPC ........... H01L 29/66734; H01L 29/0653; H01L 29/7813; H01L 29/41766; H01L 29/0696;
(Continued)

(56) References Cited

U.S. PATENT DOCUMENTS

| 6,355,532 B1 * | 3/2002 | Seliskar | B82Y 10/00 |
| | | | 257/E21.404 |
| 7,977,193 B1 * | 7/2011 | Disney | H01L 29/407 |
| | | | 257/E29.257 |
| 2012/0112268 A1 | 5/2012 | Tai et al. | |

FOREIGN PATENT DOCUMENTS

DE   10326523 A1   12/2003

OTHER PUBLICATIONS

Office Action communication of the German Patent and Trademark Office for Appln. Ser. No. 102015102115.3 dated Nov. 27, 2015.
(Continued)

*Primary Examiner* — Richard Booth
(74) *Attorney, Agent, or Firm* — Baker Botts L.L.P.

(57) ABSTRACT

A semiconductor device formed in a semiconductor substrate having a first main surface comprises a transistor array and a termination region. The transistor array comprises a source region, a drain region, a body region, a drift zone, and a gate electrode at the body region. The gate electrode is configured to control a conductivity of a channel formed in the body region. The gate electrode is disposed in first trenches. The body region and the drift zone are disposed along a first direction between the source region and the drain region, the first direction being parallel to the first main surface. The body region has a shape of a first ridge extending along the first direction. The termination region comprises a termination trench, a portion of the termination trench extending in the first direction, a length of the termination trench being larger than a length of the first trenches, the length being measured along the first direction.

20 Claims, 8 Drawing Sheets

(51) Int. Cl.
| | |
|---|---|
| *H01L 21/765* | (2006.01) |
| *H01L 21/8234* | (2006.01) |
| *H01L 27/088* | (2006.01) |
| *H01L 29/06* | (2006.01) |
| *H01L 29/66* | (2006.01) |
| *H01L 29/10* | (2006.01) |
| *H01L 29/40* | (2006.01) |
| *H01L 29/423* | (2006.01) |
| *H01L 21/265* | (2006.01) |
| *H01L 29/417* | (2006.01) |

(52) U.S. Cl.
CPC ........ *H01L 27/088* (2013.01); *H01L 29/0661* (2013.01); *H01L 29/66696* (2013.01); *H01L 29/66704* (2013.01); *H01L 29/7825* (2013.01); *H01L 21/26586* (2013.01); *H01L 29/1083* (2013.01); *H01L 29/1095* (2013.01); *H01L 29/404* (2013.01); *H01L 29/407* (2013.01); *H01L 29/41766* (2013.01); *H01L 29/4236* (2013.01)

(58) Field of Classification Search
CPC ........... H01L 29/66727; H01L 29/0661; H01L 29/7811; H01L 29/0638; H01L 29/4238; H01L 29/7823; H01L 21/765; H01L 21/823437; H01L 27/088; H01L 29/1095; H01L 29/404; H01L 29/407; H01L 29/66696; H01L 29/4236; H01L 29/7825
See application file for complete search history.

(56) References Cited

OTHER PUBLICATIONS

Office Action communication of the Japanese Patent and Trademark Office for Appln. No. 2017-018648809, dated Mar. 14, 2017.

\* cited by examiner

SEMICONDUCTOR DEVICE COMPRISING A TRANSISTOR ARRAY AND A TERMINATION REGION AND METHOD OF MANUFACTURING SUCH A SEMICONDUCTOR DEVICE

CROSS-REFERENCE TO RELATED APPLICATION

This application claims priority to German Application Serial No. 102015102115.3 filed Feb. 13, 2015 and entitled "Semiconductor Device Comprising a Transistor Array and a Termination region and Method of Manufacturing Such a Semiconductor Device".

BACKGROUND

Power transistors commonly employed in automotive and industrial electronics should have a low on-state resistance ($R_{on} \times A$), while securing a high voltage blocking capability. For example, a MOS ("metal oxide semiconductor") power transistor should be capable, depending upon application requirements to block drain to source voltages Vds of some tens to some hundreds or thousands volts. MOS power transistors typically conduct very large currents which may be up to some hundreds of amperes at typical gate-source voltages of about 2 to 20 V.

A concept for transistors having a further reduced $R_{on} \times A$ characteristic refers to lateral power FinFETs ("Field Effect Transistors comprising a fin"). Lateral power FinFETs utilize more bulk silicon for reducing $R_{on}$ so that $R_{on}$ is comparable to that of a vertical trench MOSFET. In transistors comprising a lateral field plate, the doping concentration of the drift zone may be increased, due to the compensation action of the field plate.

It is an object of the present invention to provide a semiconductor device comprising a termination region having improved properties.

SUMMARY

According to an embodiment, a semiconductor device formed in a semiconductor substrate having a first main surface comprises a transistor array and a termination region, the transistor array comprises a source region, a drain region, a body region, a drift zone, and a gate electrode at the body region. The gate electrode is configured to control a conductivity of a channel formed in the body region. The gate electrode is disposed in first trenches. The body region and the drift zone are disposed along a first direction between the source region and the drain region. The first direction is parallel to the first main surface. The body region has a shape of a first ridge extending along the first direction. The termination region comprises a termination trench, a portion of the termination trench extending in the first direction. A length of the termination trench is larger than a length of the first trenches, the length being measured along the first direction.

According to an embodiment, a method of manufacturing a semiconductor device comprising a transistor array and a termination region in a semiconductor substrate having a first main surface comprises forming a source region, a drain region, a body region, and a drift zone. The method further comprises forming a gate electrode at the body region, the gate electrode being configured to control a conductivity of a channel formed in the body region. The gate electrode is formed in first trenches, the body region and the drift zone are disposed along a first direction between the source region and the drain region, the first direction being parallel to the first main surface. The body region has the shape of a first ridge extending along the first direction. The method further comprises forming a termination trench, a portion of the termination trench extending in the first direction. A length of the termination trench is larger than a length of the first trenches, the length being measured along the first direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

Figure 1A:
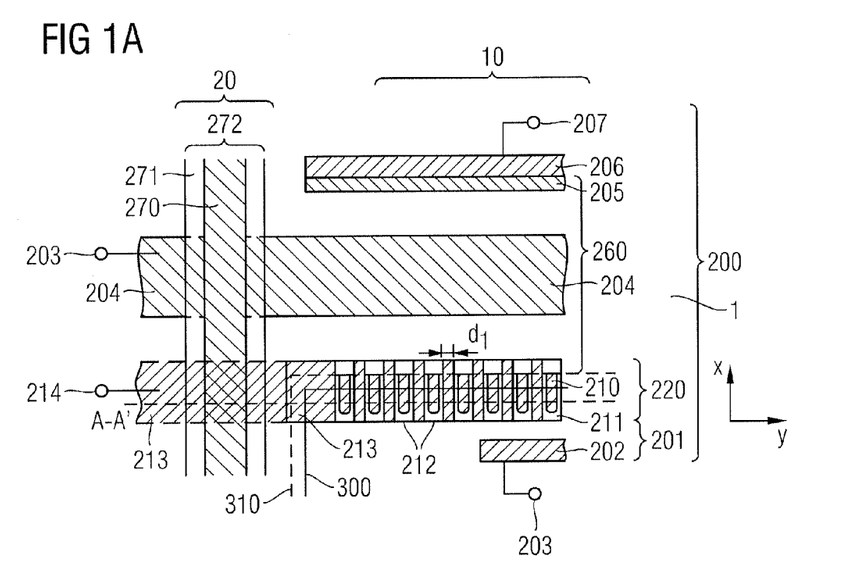
FIG. 1A shows a horizontal cross-sectional view of a semiconductor device according to an embodiment.

FIG. 1A shows a horizontal cross-sectional view of a semiconductor device according to an embodiment. The semiconductor device 1 comprises a transistor array 10 and a termination region 20 formed in a semiconductor substrate. The transistor array 10 comprises a source region 201, a drain region 205, a body region 220, a drift zone 260, and a gate electrode 210 at the body region 220. The gate electrode 210 is configured to control a conductivity of a channel formed in the body region. A gate dielectric layer 211 may be disposed between the gate electrode 210 and the body region 220. The body region 220 and the drift zone 260 are disposed along a first direction (e.g. the x direction) between the source region 201 and the drain region 205. The first direction is parallel to the first main surface. The body region 220 has the shape of a first ridge extending in a first direction. More specifically, the body region 220 is patterned into a first ridge extending along the first direction by adjacent first trenches 212 in the semiconductor substrate.

The termination region 20 comprises a termination trench 272. A portion of the termination trench 272 extends in the first direction (e.g. the x direction). A length of the termination trench 272 is larger than the length of the first trenches 212, the length being measured along the first direction.

The semiconductor device 1 comprises a transistor portion or transistor array 10 in which a plurality of single transistor cells 200 may be connected in parallel. For example, the plurality of single transistor cells 200 may comprise a common source region 201 and a common drain region 205. Moreover, each of the single transistor cells 200 comprises a gate electrode 210. For example, the gate electrode 210 may be arranged in each of the first trenches 212. The termination trench 272 may be disposed in such a manner that no short circuit between the source region 201 and the drain region 205 at the edge portion of the transistor array may take place.

As is further illustrated in FIG. 1A, the gate dielectric layer 211 has a larger thickness at the side of the gate electrode facing the drain region 205 than at a portion of the gate electrode 210 facing the source region 201. Thereby, a gate-drain capacitance may be further reduced. However, as is to be clearly understood, the thickness of the gate dielectric layer 211 may be chosen so as to provide the desired device characteristics. As is further indicated in FIG. 1A, the source region 201 may be connected via a source contact 202 to a source terminal 203. Further, the drain region 205 may be electrically connected via a drain contact 206 to a drain terminal 207. The length of the source contact 202 may be chosen so that some of the transistor cells at the edge of the array of first trenches close to the termination trench 272 will not be electrically connected to the source terminal. As a result, a leakage current between source region 201 and drain region 205 may be further reduced.

The body region may be doped so as to be of the second conductivity type, whereas the source region 201 and the drain region 205 are of the first conductivity type. A semiconductor portion 120 below the body region 220 may be doped with the first conductivity type. The position of a mask for doping the body region 220 with dopants of the second conductivity type is indicated by reference numeral 300. Reference numeral 310 denotes a boundary of the body region 220 taking into account diffusion of dopants.

According to an embodiment, a planar source contact line 204 may be disposed over portions of the drift zone 260. The source contact line 204 may be electrically connected to the source terminal 203 and it may act as a field plate.

Figure 1B:
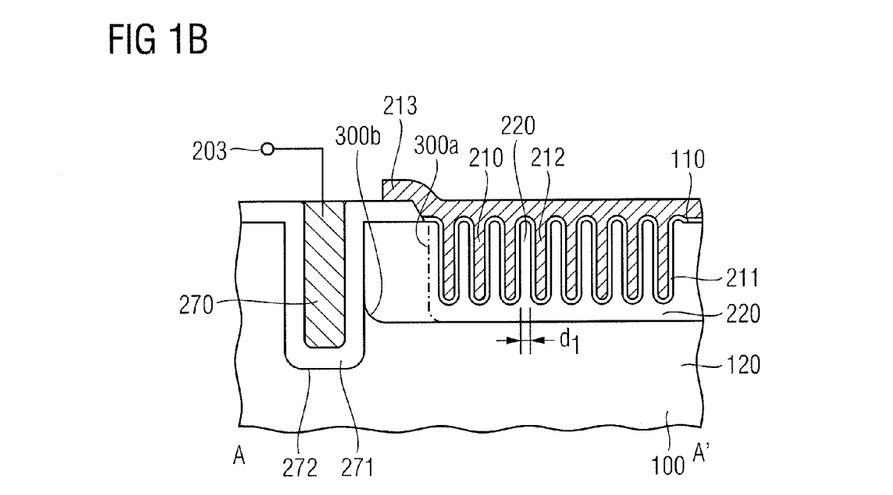
FIG. 1B shows a cross-sectional view of the semiconductor device.

FIG. 1B shows a cross-sectional view which is taken between A-A', as is also illustrated in FIG. 1A. In particular, the cross-sectional view of FIG. 1B is taken so as to intersect the termination trench 272 and the plurality of first trenches 212. As is shown, the termination trench 272 is disposed on a side of the array of first trenches 212. The termination trench 272 may extend to a deeper depth than the first trenches 212. Further, the termination trench may have a larger width than the first trenches, wherein the width is measured along a direction perpendicularly with respect to the first direction (e.g., the y direction). An insulating layer 271 is disposed on the sidewalls and the bottom side of the termination trench 272. A conductive material 270 may be filled in the termination trench 272. For example, the conductive material 270 may be electrically coupled to a source terminal 203. The first trenches are formed in the first main surface 110 of a semiconductor substrate 100. A dielectric layer may be formed so as to line the sidewalls and the bottom and the top side of each of the first trenches 212. Further, a conductive material may be filled in the trenches 212 to form the gate electrode 210. A gate connection line 213 may electrically connect adjacent trenches with each other. The gate connection line 213 may be electrically connected to a gate potential. According to an embodiment, as is indicated by broken lines, the gate connection line 213 may be routed over the termination trench. The first trenches 212 pattern the body region 220 into first ridges which extend along the first direction. Reference numerals 300a, 300b illustrate a boundary between semiconductor portions of the first and second conductivity type in devices according to different embodiments.

Generally, it is attempted to dispose the termination trench 272 in direct contact with the body region 220 of the second conductivity type, as is indicated by reference numeral 300b. In such a case, a leakage current may be prevented from being short circuited between the source region 201 and the drain region 205 at the edge portions at the array of first trenches 212. However, as will be explained later, due to process constraints, it may be advantageous to move this boundary near the first trench 212 which is disposed at the edge of the array of first trenches. In such a case, this boundary is as indicated by reference sign 300a.

According to an embodiment, the width d1 of the body region 220 or the distance between adjacent first trenches 212 may fulfill the following formula:

$d_l \leq 2 \times l_d$, wherein $d_l$ denotes a length of a depletion zone which is formed at the interface between the gate dielectric layer 211 and the body region 220. For example, the width of the depletion zone may be determined as:

$$l_d = \sqrt{\frac{4\varepsilon_s kT \ln(N_A/n_i)}{q^2 N_A}}$$

wherein $\varepsilon_S$ denotes the permittivity of the semiconductor material ($11.9*\varepsilon_0$ for silicon), k denotes the Boltzmann constant ($1.38066*10^{-23}$ J/K), T denotes the temperature (e.g. 300K), ln denotes the natural logarithm, $N_A$ denotes the impurity concentration of the semiconductor body, $n_i$ denotes the intrinsic carrier concentration ($1.45*10^{10}$ for silicon at 27° C.), q denotes the elementary charge ($1.6*10^{-19}$ C).

Generally, it is assumed that in a transistor, the length of the depletion zone at a gate voltage corresponding to the threshold voltage corresponds to the maximum width of the depletion zone. For example, the distance between the first trenches may be approximately 20-130 nm, for example, 40-120 nm along the first main surface 110 of the semiconductor substrate 100.

In case of being switched on, a conductive inversion layer is formed at the boundary between the body region 220 and the gate dielectric layer 211. Accordingly, the transistor is in a conducting state from the source region 201 to the drain region 205 via the drain extension region or drift zone 260. In case of switching-off, no conductive inversion layer is formed, resulting in a blocking of the current flow.

Figure 2A:
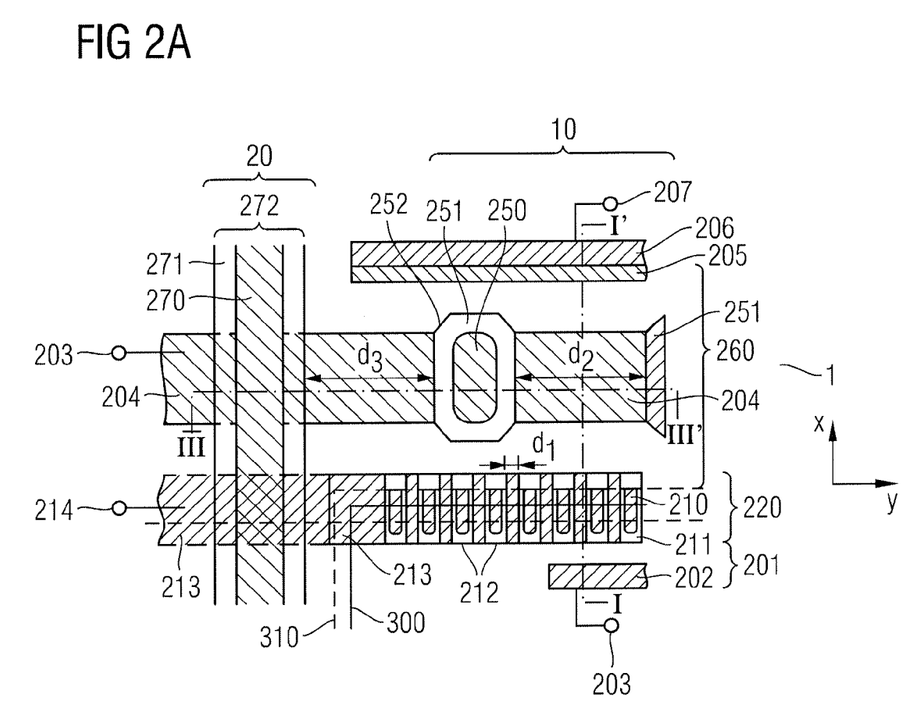
FIG. 2A shows a horizontal cross-sectional view of a semiconductor device according to a further embodiment.

FIG. 2A shows a horizontal cross-sectional view of a semiconductor device according to a further embodiment. In addition to all the components illustrated with reference to FIG. 1A, the embodiment of FIG. 2A additionally comprises field plate trenches 252, which extend in the first direction. The field plate trenches 252 are arranged along the first direction between the first trenches 212 and the drain region 205. For example, the field plate trenches may be arranged at a distance of d2 between adjacent trenches. According to an embodiment, the distance between the field plate trenches d2 corresponds to the distance d3 between the field plate trench 252 at the edge of array and the termination trench 272.

When the semiconductor device comprising the field plate trenches 252 is switched-off, the carriers in the drift zone 260 may be depleted more easily due to the presence of the field plate trenches 252. As a consequence, the doping concentration of the drift zone 260 may be increased, resulting in a reduced $R_{on} \times A$ of the resulting device. When the distance between the termination trench 272 and the field plate trench 252 adjacent to the termination trench 272 is smaller than or equal to the distance between the field plate trenches 252, in case of switching-off, no breakdown may occur at the edge of the transistor array. Differently speaking, if d3 is larger than d2, carriers may flow between the body region 220 and the drain region 205, since the depletion does not extend over the whole width d3. A field dielectric layer 251 may be disposed at the sidewalls and the bottom side of the field plate trenches 252. Further, a conductive material may be filled in the field plate trenches. The conductive material 250 may be electrically connected to the source contact line 204. The source contact line 204 may be electrically coupled to a source terminal 203.

Figure 2B:
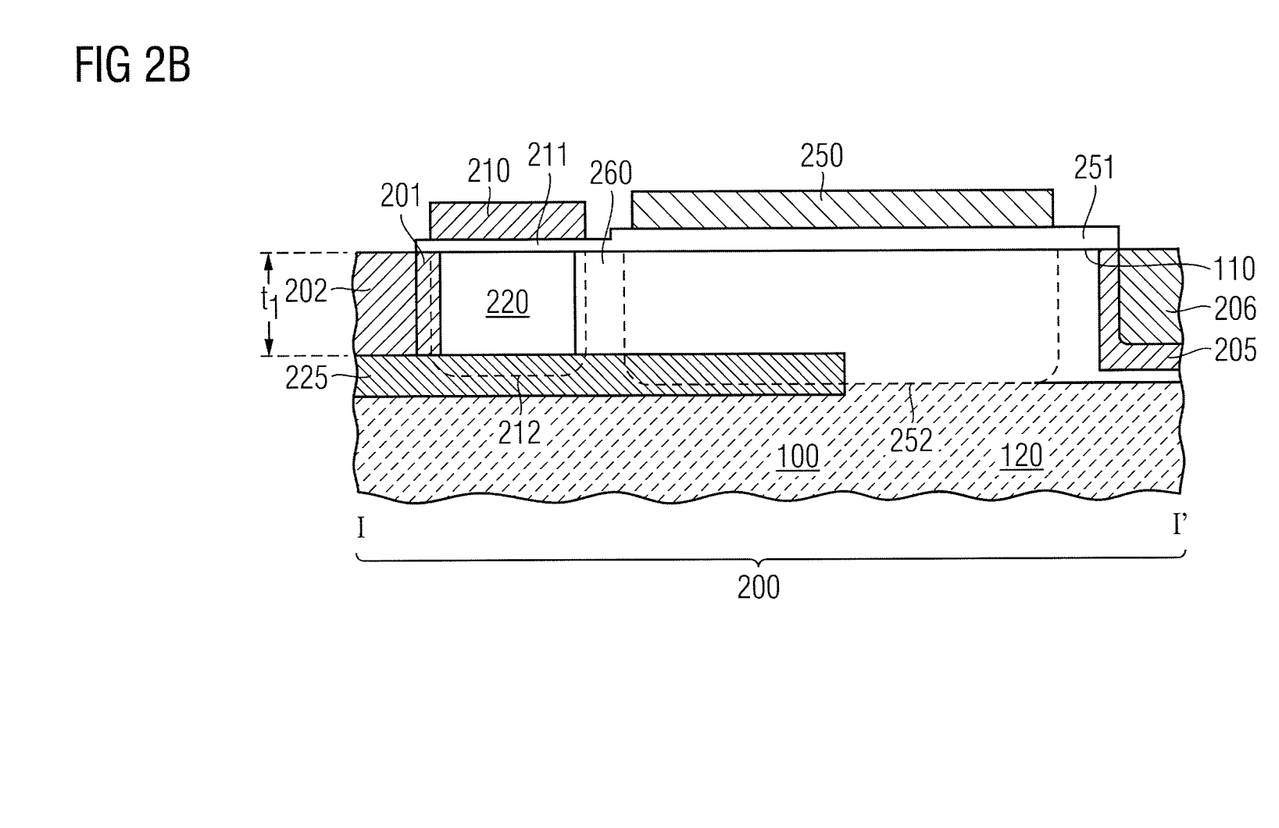
FIG. 2B shows a cross-sectional view of the semiconductor device along a first direction.

FIG. 2B shows a cross-sectional view of the semiconductor device illustrated in FIG. 2A between I and I'. The cross-sectional view is taken so as to intersect a single transistor cell across the body region 220, between adjacent first trenches 212. The direction between I and I' corresponds to the first direction. As is shown, the source region 201 extends from the first main surface 110 into a depth direction of the semiconductor substrate 100, i.e. perpendicularly with respect to the first main surface 110. The body region 220 and the drift zone 260 are disposed along a first direction which is parallel to the first main surface 110 between the source region 201 and the drain region 205. The drain region 205 likewise extends from the first main surface 110 in a depth direction of the substrate. As is indicated by dotted lines, in a plane before and behind the depicted plane of the drawing, first trenches (gate trenches) 212 are disposed adjacent to the body region 220. In a corresponding manner, field plate trenches 252 may be disposed adjacent to the drift zone 260. The first trench 212 and the field plate trench 252 extend from the first main surface 110 in a depth direction of the substrate. As a consequence, the body region 220 is patterned into the shape of a first ridge. Due to the presence of the field plate trenches 252, the drift zone 260 is patterned into the shape of a second ridge.

FIG. 2B further shows a body contact portion 225 that is disposed beneath the body region 220 and beneath a part of the drift zone 260. The body contact portion 225 connects the body region 220 to the source contact 202 so as to avoid a parasitic bipolar transistor which could be otherwise formed at this portion. Moreover, the body contact portion 225 extends beneath the drift zone 260 so that in an off-state of the transistor 200, the drift zone 260 may be depleted more easily.

Figure 2C:
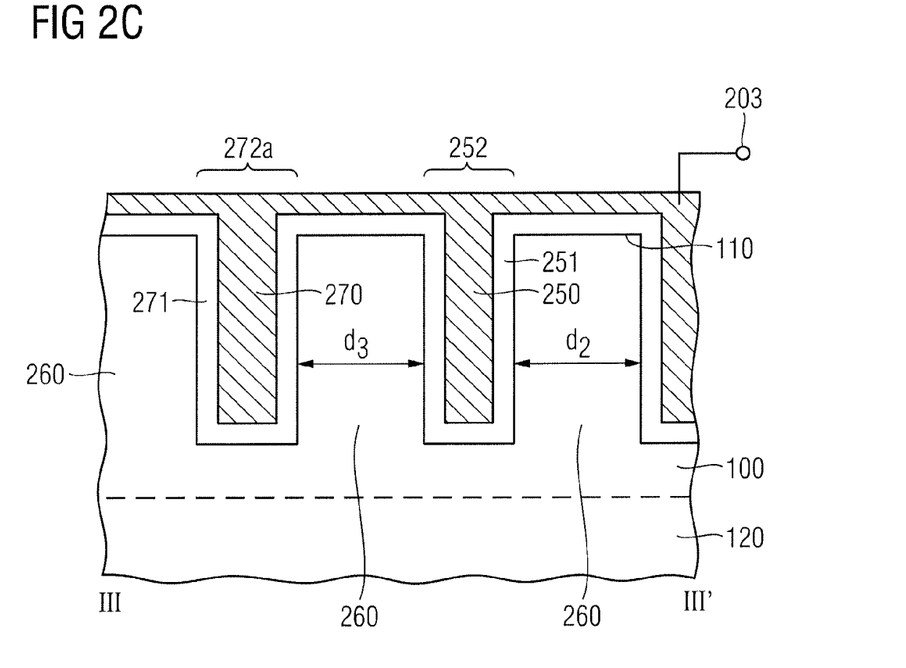
FIG. 2C shows a cross-sectional view of further components of the semiconductor device along a second direction.

FIG. 2C shows a cross-sectional view of the semiconductor device between III and III' as is also illustrated in FIG. 2A. The cross-sectional view is taken so as to intersect the termination trench 272 and the field plate trenches 252. The field plate trenches 252 and the termination trench 272 are formed in the first main surface 110 of a semiconductor substrate 100. The field plate trenches 252 may extend to the same depth as the termination trench 272 and may have the same width, the width being measured along the second direction. An insulating layer 271, 251 is disposed at the sidewalls of the termination trench 272 and the field plate trenches 252. A conductive material 270, 250 is filled in the termination trench 272 and the field plate trenches 252. The same material may be filled in the termination trench 272 and the field plate trenches 252 so as to provide an electrical connection between the field plates and the termination trench. As becomes apparent from FIG. 2C, the termination trench 272 is adjacent to the drift zone 260 and similar in structure and geometry to any of the field plate trenches 252. The distance d2 between the field plate trenches 252 may be equal to or larger than a distance d3 between the termination trench 272 and the field plate trench 252 adjacent to the termination trench 272. A pitch between adjacent field plate trenches 252 may be equal to or larger than a pitch between adjacent first trenches in which the gate electrode is disposed. Generally, the term "pitch" denotes the sum of the width and the distance of adjacent trenches, e.g. field plate trenches 252 or first trenches 212. Accordingly, if the field plate trenches 252 and the first trenches 212 have the same pitch the relationship of the distance between field plate trenches 252 and the distance between first trenches depends from the width of each of the trenches. If the width between field plate trenches 252 is larger than the width between first trenches 212, the distance between the field plate trenches is smaller than the distance between the first trenches 212.

According to concepts, when manufacturing a transistor in which the body region is patterned into a first ridge extending along the first direction by adjacent first trenches in the semiconductor substrate, one single mask may be used for removing silicon oxide from etched trenches and for performing doping processes so as to define the doped body region. By using a single mask, a perfect self-alignment between the remaining oxide portions and the doped portions may be achieved. In the context of the present specification, the term "single mask" is intended to mean that the mask may be further modified after performing the first processing. For example, the mask may be trimmed, i.e. etched at its edges, after performing the first processing. The concept of using a single mask may be further developed so as so make sure than on one side, the doped body region is arranged so as to be very close to the termination trench 272. On the other side, the insulating material adjacent to the drift zone 260 should be maintained at the sidewall of the termination trench 272.

According to an embodiment, this may be accomplished, by dividing the termination trench 272 into a first termination trench portion 272b which is adjacent to the first trenches 212 and a second termination trench portion 272a adjacent to the field plate trenches 252. Processing may be accomplished so as to maintain a thick dielectric layer 271 at a sidewall adjacent to the drift zone 260 and at the same time to move the doped body region 220 in close spatial relationship to the first termination trench portion 272b. According to the embodiment illustrated in FIG. 3A, a width of the first termination trench portion 272b is smaller than the width of the second termination trench portion 272a. For example, the first trenches 212 may be shifted in a direction of the termination trench 272 so as to have a small distance between the first trenches 212 and the first termination trench portion 272b. Due to the differing width of the first termination trench portions 272b and the second termination trench portion 272a, the second termination trench portion 272a may be disposed so as to overlap with first trenches 212 along the second direction. Accordingly, a mask may be used which entirely covers the second termination trench portion 272a so that no dielectric layer is removed from the sidewall of the second termination trench portion 272a. For example, such a mask may be used when using one single mask for removing the dielectric layer and for performing the doping process. The position of the mask is designated by reference numeral 300.

Figure 3A:
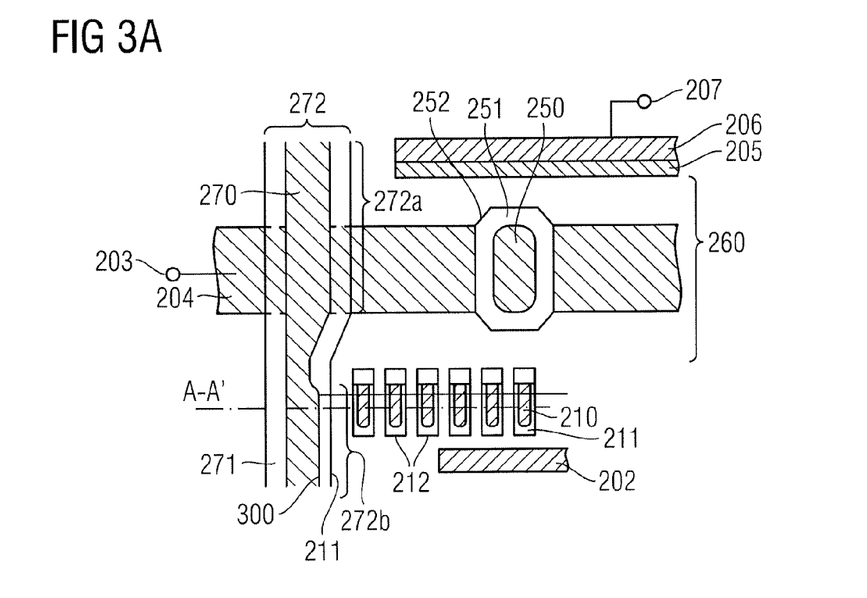
FIG. 3A shows a horizontal cross-sectional view of a semiconductor device according to a further embodiment.
Figure 3B:
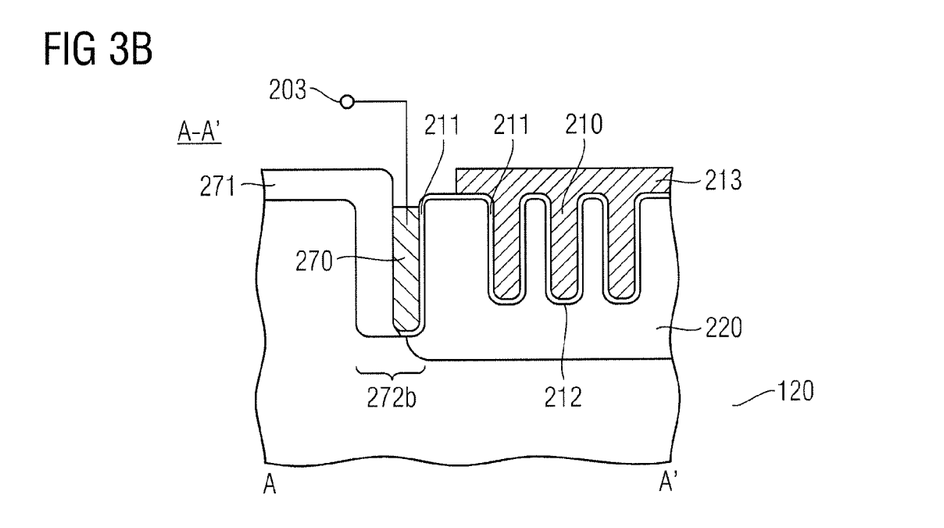
FIG. 3B shows a cross-sectional view of a further portion of the semiconductor device.

FIG. 3B shows a cross-sectional view between A and A' as is also illustrated in FIG. 3A. The cross-sectional view is taken so as to intersect the first termination trench portion 272b and the first trenches 212. As is also indicated in FIG. 3A due to the position of the etching mask 300, a portion of the dielectric layer 271 is removed from the sidewall of the first termination trench portion 272b which faces the first trenches 212.

Due to the further processing which forms a gate dielectric layer 211 on the sidewalls of the first trenches 212, also a gate dielectric layer 211 is formed on the "inner" sidewall of the first termination trench portion 272b. Further, due to the position of this combined mask, the doped body region 220 extends to the first termination trench portion 272b.

Figure 4:
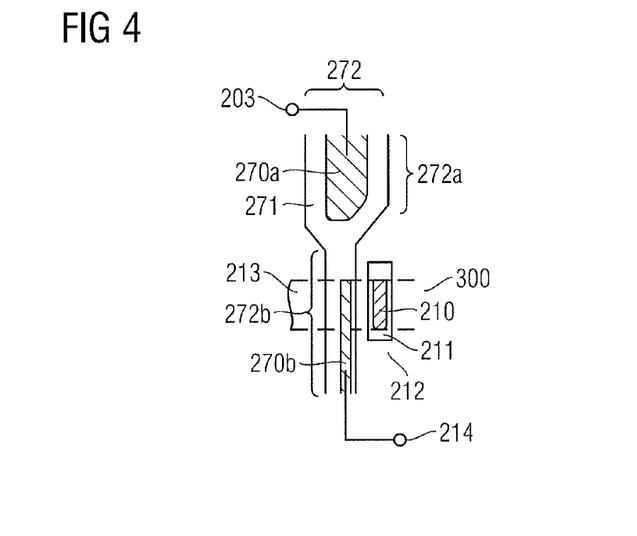
FIG. 4 shows a horizontal cross-sectional view of a portion of a further embodiment of a semiconductor device.

According to a further embodiment, the conductive material of the first and second termination trench portions may be insulated from each other. FIG. 4A shows an example of such an implementation. FIG. 4A illustrates a first termination trench portion 272b and a second termination trench portion 272a, being components of a termination trench 272. A field dielectric layer 271 is formed at the sidewalls of the second termination trench portion 272a. Further, a thinner gate dielectric layer 211 is formed at the "inner" sidewall of the first termination trench portion 272b. Between the two portions of the termination trench, the field dielectric layer 271 may perform electrical isolation between conductive material formed in the first and second termination trench portions 272b, 272a. A first conductive material 270b is formed in the first termination trench portion 272b, and a second conductive material 270a is formed in the second termination trench portion 272a. As is to be clearly understood, the first and second conductive materials 270a, 270b may comprise the same material. The first conductive material 270b may be electrically connected to the gate terminal 214, and the second conductive material 270a may be electrically connected to the source terminal 203, for example. As is to be clearly understood, any other terminal may be electrically connected to any of these conductive materials, depending on the requirements of the device. As is indicated by broken lines, the gate electrode 210 may be electrically connected to a gate terminal 214 by means of a gate connection line 213. The gate connection line 213 may be routed over the termination trench 272.

For example, the first termination trench portion 272b may extend to a smaller depth than the second termination trench portion 272a. According to an embodiment, such a termination trench may be formed using an etching process in a trench having two different widths. Due to the different widths, etching in the second termination trench portion 272a may be performed so as to extend to a deeper depth than the first termination trench portion 272b.

By forming a termination trench 272 having different portions, each portion of the termination trench may be adapted in geometry and structure to the requirements of the surrounding at each of the portions. For example, for the field plate trench portion that is adjacent to the field plate trenches it is desirable that the field dielectric layer 271 adjacent to the drift zone 260 has a larger thickness and that the distance between the second termination trench portion and the adjacent field plate trench 252 is equal or smaller than the distance between adjacent field plate trenches. On the other side, for the first termination trench portion 272b that is adjacent to the first trenches 212, it is desirable that the doped body region 220 extends to the termination trench. Due to this concept, each of the portions of the termination trench may be adjusted to the requirements of the surroundings.

According to embodiments, the semiconductor device comprises a plurality of single transistor cells 10 which may be connected in parallel. The pattern of the single transistor cells 200 may be repeated and mirrored along the first and the second directions. The termination trench 272 may be disposed so as to enclose the transistor array. The single transistor cells 200 and the termination trench 272 may be implemented in any manner as has been described herein above.

Figure 5A:
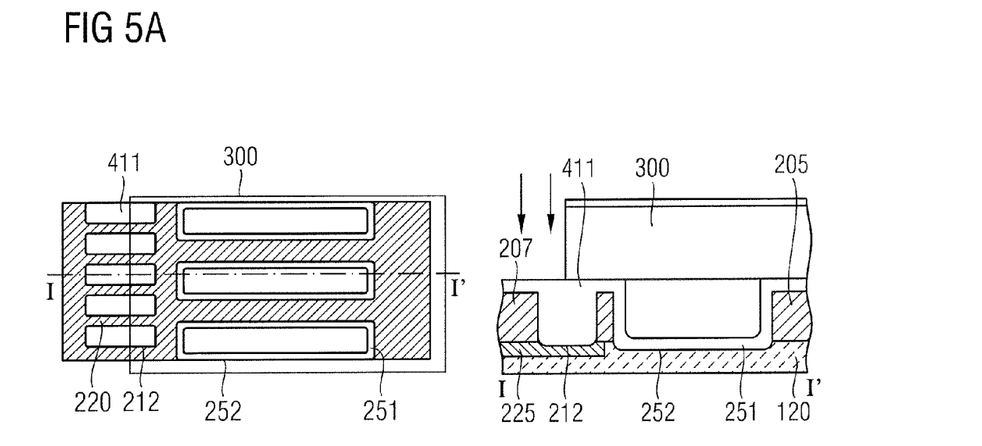
FIGS. 5A to 5C illustrate steps when manufacturing the semiconductor device.
Figure 5B:
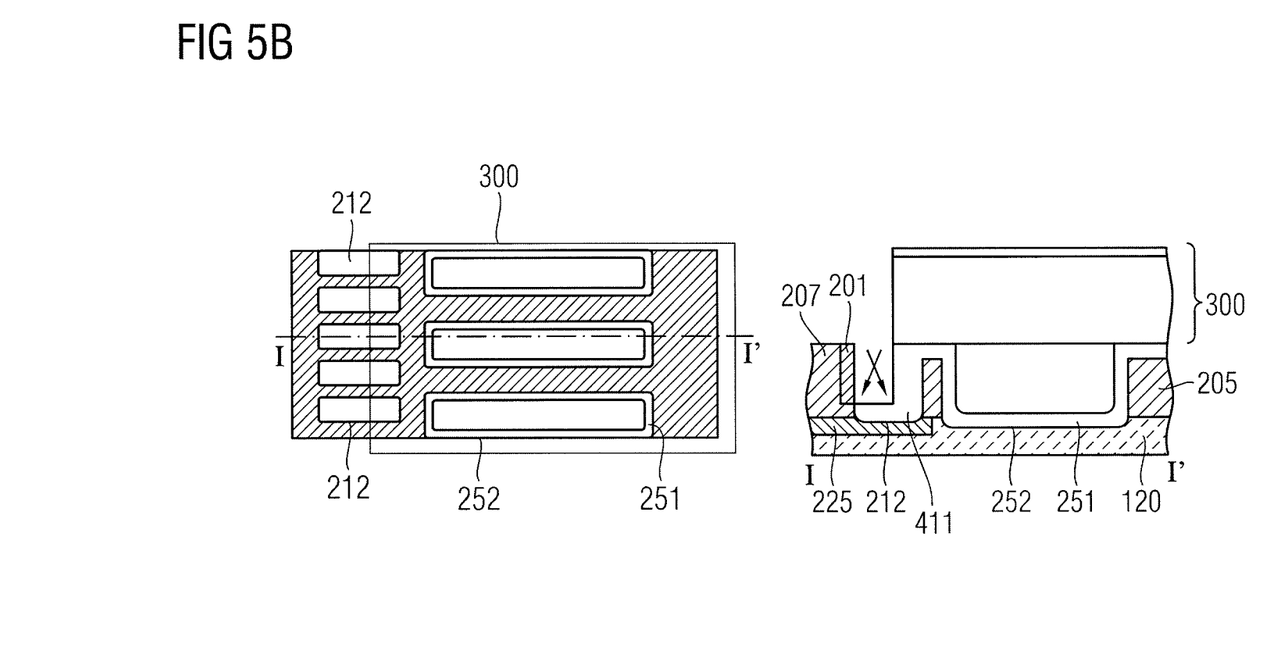
Figure 5C:
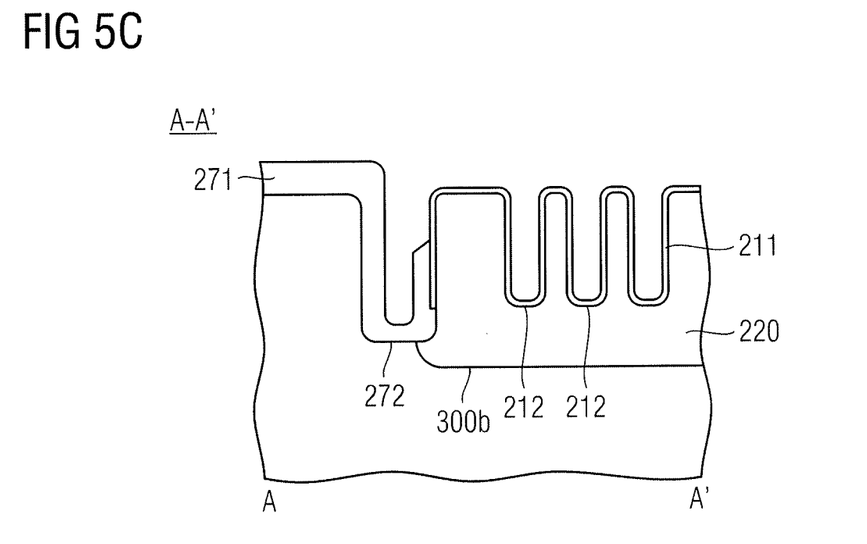

FIGS. 5A to 5C illustrate steps when forming the semiconductor device using a common or one single mask, respectively, for removing a dielectric material and for performing doping processes.

Starting point for explaining details of the manufacturing process is a semiconductor substrate including etched first trenches 212 and etched second trenches 252 defining field plate trenches. Various doping processes have already been performed for defining drain regions 205 and body contact portions 225. A silicon oxide layer 401 has been formed over the structure. Due to the different widths of the trenches, the first trenches 212 are entirely filled with the silicon oxide layer, whereas the silicon oxide layer forms the field dielectric layer 251 on the sidewalls and the bottom side of the field plate trenches 252. A hard mask layer 300 has been formed over the resulting structure and has been patterned leaving a portion of the first trenches 212 and the semiconductor material between the first trenches 212 uncovered.

FIG. 5A shows an example of such a structure. As is illustrated in the left-hand portion of FIG. 5A, a right-hand portion of the first trenches 212 is covered by the hard mask layer 300, whereas the left-hand portion of the first trenches is uncovered. The right-hand portion of FIG. 5A shows a cross-sectional view of the substrate illustrating the first trenches 212 and the field plate trenches 252 covered by the hard mask 300. As is indicated by arrows, an etching step is performed so as to remove the silicon oxide layer 411 from uncovered portions. As a result, the silicon oxide layer 411 is entirely removed from the left-hand sidewall of the first trenches 212 and a small portion remains in the bottom portion of the first trenches 212. Further, the silicon oxide layer 411 has been removed from the first main surface 110.

Further, tilted ion implantation steps are performed, as is indicated by the arrows depicted in the right-hand portion of FIG. 5B. The tilted ion implantation step is performed so as to dope semiconductor portions in a semiconductor portion disposed before and behind the depicted plane of the drawing. In more detail, the body portions between adjacent first trenches 212, which are also shown in the left-hand portion of FIG. 5B, are doped due to this doping step. Due to the use of one single mask 300 for performing these processes of etching the silicon oxide layer 411 and doping the body regions 220, the alignment of these portions can be improved. Generally, the mask 300 may be further modified, e.g., by pulling back so that the alignment may be performed taking into account struggle during the ion implantation. The succession of steps may be selected in accordance with the process requirements.

FIG. 5C shows a cross-sectional view of the first trenches 212 including the termination trench 272 after performing the processing according to an embodiment. The position of the cross-sectional view of FIG. 5C approximately corresponds to the position of the cross-sectional view of FIG. 3B. According to this embodiment, a portion of the dielectric layer 271 on the "inner" sidewall of the termination trench is removed and has been replaced by the thin gate dielectric layer 211, whereas a lower portion of this dielectric layer on the sidewall of the termination trench has been maintained. Accordingly, the dielectric layer 271 provides a sufficient insulation between the conductive material in the termination trench and the semiconductor body. The body region 220 of the transistor extends to the termination trench 272.

Figure 6:
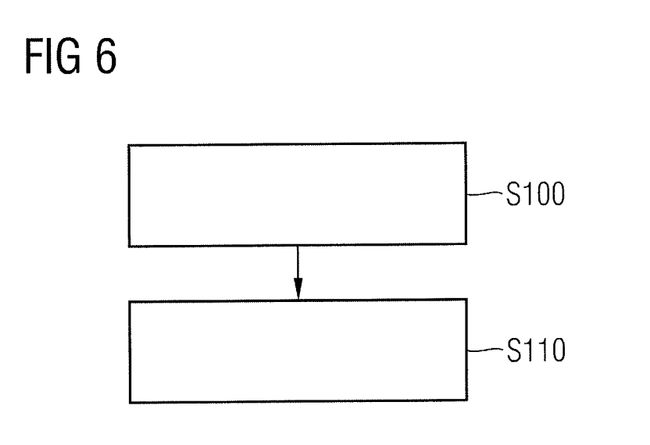
FIG. 6 summarizes the method of manufacturing a semiconductor device.

FIG. 6 illustrates steps of manufacturing a semiconductor device comprising a transistor array and a termination region. As is illustrated, the method comprises forming a source region, a drain region, a body region, a drift zone, and a gate electrode at to the body region (S100). The gate electrode is configured to control a conductivity of a channel formed in the body region, the body region and the drift zone being disposed along a first direction between the source region and the drain region, the first direction being parallel to the first main surface. The body region is patterned into a first ridge extending along the first direction by adjacent first trenches in the semiconductor substrate. The method further comprises forming a termination trench (S110). A portion of the termination trench extends in the first direction, a length of the termination trench being larger than the length of the gate trenches, the length being measured along the first direction. According to a further embodiment, the semiconductor device may be a component of an electronic device such as a bridge circuit, a converter, an inverter and a motor drive. Accordingly, a further embodiment relates to such an electronic device comprising the semiconductor device that has been described herein above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device formed in a semiconductor substrate having a first main surface comprising:
a transistor array comprising:
a source region;
a drain region;
a body region;
a drift zone;
a gate electrode at the body region, the gate electrode being configured to control a conductivity of a channel formed in the body region, wherein:
the gate electrode is disposed in a plurality of first trenches;
the body region and the drift zone is disposed along a first direction between the source region and the drain region;
the first direction is parallel to the first main surface;
the body region has a shape of a first ridge extending along the first direction;
a plurality of field plate trenches extending in the first direction, the field plate trenches being arranged along the first direction between the first trenches and the drain region, the field plate trenches being filled with conductive material that is electrically connected to a source contact line that is electronically coupled to a source terminal; and
a termination region comprising a termination trench, a portion of the termination trench extending in the first direction, a length of the termination trench being larger than a length of the first trenches, the length being measured along the first direction.

2. The semiconductor device according to claim 1, wherein the plurality of first trenches pattern the body region into the shape of the ridge.

3. The semiconductor device according to claim 1, wherein an insulating layer is disposed on sidewalls and a bottom side of the termination trench and a conductive material is filled in the termination trench.

4. The semiconductor device according to claim 1, wherein a distance between the field plate trenches is equal to or larger than a distance between the termination trench and the field plate trench adjacent to the termination trench.

5. The semiconductor device according to claim 1, wherein a width of a portion of the termination trench is equal to a width of the field plate trenches, the width being measured in a direction perpendicular to the first direction.

6. The semiconductor device according to claim 1, wherein a width of the termination trench is varying along the first direction.

7. The semiconductor device according to claim 1, wherein the termination trench comprises a first termination trench portion adjacent to the first trenches and a second termination trench portion adjacent to the field plate trenches.

8. The semiconductor device according to claim 7, wherein the width of the first termination trench portion is smaller than the width of the second termination trench portion.

9. The semiconductor device according to claim 7, further comprising a conductive material in the first termination trench portion and a conductive material in the second termination trench portion, the conductive material in the first termination trench portion being insulated from the conductive material in the second termination trench portion and being connected with different terminals, respectively.

10. The semiconductor device according to claim 7, wherein a depth of the first termination trench portion is smaller than a depth of the second termination trench portion.

11. The semiconductor device according to claim 7, wherein a conductive material is disposed in the termination trench, the conductive material being insulated from adjacent semiconductor material by an insulating layer, wherein a thickness of the insulating layer is larger in the second termination trench portion than in the first termination trench portion.

12. The semiconductor device according to claim 9, wherein the conductive material in the first termination trench portion is connected with a gate terminal, a gate connection line connecting the gate terminal with the gate electrodes being routed over the first termination trench portion.

13. The semiconductor device according to claim 1, wherein a pitch between adjacent field plate trenches is equal to or larger than a pitch between adjacent first trenches.

14. The semiconductor device according to claim 1, wherein the transistor array is enclosed by the termination trench.

15. The semiconductor device according to claim 1, wherein a part of the termination trench has a greater depth than another part of the termination trench.

16. A method of manufacturing a semiconductor device comprising a transistor array and a termination region in a semiconductor substrate having a first main surface, the method comprising:
forming a source region, a drain region, a body region, and a drift zone;
forming a gate electrode at the body region, the gate electrode being configured to control a conductivity of a channel formed in the body region, the gate electrode being formed in a plurality of first trenches, the body region and the drift zone being disposed along a first direction between the source region and the drain region, the first direction being parallel to the first main surface, the body region having the shape of a first ridge extending along the first direction;
forming a plurality of field plate trenches extending in the first direction, the field plate trenches being arranged along the first direction between the first trenches and the drain region, the field plate trenches being filled with conductive material that is electrically connected to a source contact line that is electronically coupled to a source terminal;
forming a termination trench, a portion of the termination trench extending in the first direction, a length of the termination trench being larger than a length of the first trenches, the length being measured along the first direction; and
forming an insulating layer on sidewalls and a bottom side of the termination trench and filling a conductive material in the termination trench.

17. The method according to claim 16, wherein the termination trench and the field plate trenches are formed using joint processing steps.

18. The method according to claim 16, wherein the termination trench and the field plate trenches are patterned using one common photomask.

19. The method according to claim 16, wherein forming the gate electrode comprises forming a plurality of first trenches in the first main surface, the first trenches extending in the first direction.

20. An electronic device comprising the semiconductor device according to claim 1, the electronic device being selected from the group of a bridge circuit, a converter, an inverter and a motor drive.

* * * * *